United States Patent [19]

Cho et al.

[11] Patent Number: 5,097,441

[45] Date of Patent: Mar. 17, 1992

[54] INTERDIGITATED AND TWISTED WORD LINE STRUCTURE FOR SEMICONDUCTOR MEMORIES

[75] Inventors: Soo-In Cho; Dong-Il Shu; Dong-Sun Min; Young-Rae Kim, all of Seoul, Rep. of Korea

[73] Assignee: SamSung Electronics Co., Ltd., Suwon, Rep. of Korea

[21] Appl. No.: 501,758

[22] Filed: Mar. 30, 1990

[30] Foreign Application Priority Data

Dec. 29, 1989 [KR] Rep. of Korea ............... 20108-1989

[51] Int. Cl.⁵ .......................................... G11C 13/00
[52] U.S. Cl. ...................................... 365/51; 365/63; 365/230.06
[58] Field of Search ............... 365/51, 230.06, 189.01, 365/63

[56] References Cited

U.S. PATENT DOCUMENTS 4,586,171  4/1986  Fujishima ..................... 365/205
4,916,661  4/1990  Nawaki et al. ................. 365/51
4,977,542  12/1990 Matsuda et al. ................ 365/207

Primary Examiner—Terrell W. Fears
Attorney, Agent, or Firm—Robert E. Bushnell

[57] ABSTRACT

A higher packing of cells in a memory circuit includes a plurality of word line drivers employing a plurality of word lines, a plurality of bit lines, and various decoders. Disclosed is the array method of the word line drivers, which can reduce the pitch between the word line drivers so that the layout of the semiconductor memory array may be easily accomplished. Moreover, the array method of other components of the memory array is suggested.

8 Claims, 3 Drawing Sheets

INTERDIGITATED AND TWISTED WORD LINE STRUCTURE FOR SEMICONDUCTOR MEMORIES

BACKGROUND OF THE INVENTION

The present invention relates to a semiconductor memory array and, more particularly, to a layout method of the semiconductor memory array. Memory elements or cells of the semiconductor memory device are influenced by the problems which are caused by the layout of more densely packed cells of the memory array, because the semiconductor memory device tends to higher and higher packing of the cells of a memory circuit in a minute chip area.

Particularly, in a memory cell array having a plurality of bit lines and a plurality of word lines, the narrower pitch between the lines because of its tendency to higher packing of cells of the circuit, brings about capacitive couplings between the lines when a signal is transmitted through a line. The capacitive coupling between the lines is doubled by the capacitive component of the line itself.

The larger the capacity of the semiconductor memory device, the longer the length of the word line, and the narrower the pitch between the word lines.

However, since the time required to access the memory cell depends upon the length of the word line, the longer word line is undesirable. In general, to compensate for the access time delay, a metal layer is formed on polysilicon which is the matter of the word line, so that high speed operation has been possible. However, coating the word lines with the metal causes the capacitive coupling between the lines to be larger due to the narrower pitch between the lines. Moreover, noise due to capacitive coupling between the metals is generated. Because the noise due to the capacitive coupling between the word lines is charged or discharged when one word line is selected, it is impossible to guide a correct memory operation in high speed.

Of course, since a semiconductor device incorporating miniaturization of the metal oxide semiconductor transistor cell and minutely scaled layout of the memory array according to higher packing of the cells of the memory circuit has a high level driving voltage to drive the word lines, it is unable to neglect the noise due to the high level driving voltage. Therefore, if the method of lowering the driving voltage to drive the word line to less than 5 volts is adopted in order to remove this noise, a problem exists in that the transistor requires its own threshold voltage to be operated.

On the other hand, another problem caused by the higher packing of cells of the memory circuit is that since the row address decoders selecting one bit line among a plurality of bit lines are arranged in the limited memory area, the fabrication process of the transistor and the layout of the memory array is difficult.

Particularly, in a semiconductor memory device having a plurality of decoders, the more complicated the memory array is, the more increased the number of strapping lines, and the greater the number of the signal lines.

The word line driver applies the driving voltage for selecting a given word line to the correspondent word line, the driver being supplied with an address signal from the row address decoder. Therefore, as described above, as the pitch between the word lines becomes more narrow, arranging the word line drivers in the limited memory area is more difficult.

The conventional memory array; having several problems as described above, is illustrated in FIG. 1. Referring to FIG. 1, the array includes a plurality of bit lines $BL_1$-$BL_j$, and a plurality of word lines arranged across the bit lines, and word drivers 1 coupled to the word lines arranged on one side of the memory array. The memory cells are arranged on the crossing points of the word lines and the bit lines, the memory of the present invention has folded bit lines. In read operation of the memory device, the information being stored in the cell selected by the word line is loaded on the selected bit line, and then the sense amplifier selected by the bit line reads the information. At this time, the coupling capacitance between the selected word line and the neighboring word line is illustrated in FIG. 3A. Referring to FIG. 3A, capacitive components will be described according to the memory array of FIG. 1.

Coupling capacitances $C_{12}$, $C_{23}$, $C_{34}$, $C_{45}$ between the word lines $WL_1$-$WL_4$, and substrate capacitances $C_1$, $C_2$, $C_3$, $C_4$ of the word lines $WL_1$-$WL_4$ are presented. Therefore, when any word line is selected, the voltage of word line coupling noise is:

$$V_{CP} = \frac{C_c}{C_s + C_c} \times V_{WL} \tag{1}$$

($V_{CP}$: voltage of word line coupling noise
$V_{WL}$: driving voltage of selected word line
Cs: substrate capacitance of word line
Cc: coupling capacitance)

The substrate capacitance Cs of the word line depends on the metal formation of the word line and on the characteristics of the substrate, so that the substrate capacitance Cs may be regarded as the constant. The driving voltage $V_{WL}$ of the word line is the factor to effect the word line coupling noise, but since the driving voltage for driving the word line is, at most, equal to the threshold voltage of the memory cell transistor, the term $V_{WL}$ is neglectable. Therefore, it can be easily understood by one skilled in the art that the important factor to effect the word line coupling noise is the coupling capacitance Cc.

SUMMARY OF THE INVENTION

Accordingly, it is an object of the present invention to provide a semiconductor memory array for minimizing the word line coupling noise while the word line is in operation and for easily accomplishing a layout of the memory array.

According to an aspect of the present invention, the memory array of the present invention includes a plurality of word lines and a plurality of word line drivers having at least four word lines arranged in a zigzag on both sides of the memory array.

BRIEF DESCRIPTION OF THE DRAWINGS

For a better understanding of the invention and to show how the same may be carried into effect, reference will now be made, by way of example, to the accompanying diagrammatic drawings, in which.

DETAILED DESCRIPTION OF THE INVENTION

Figure 1:
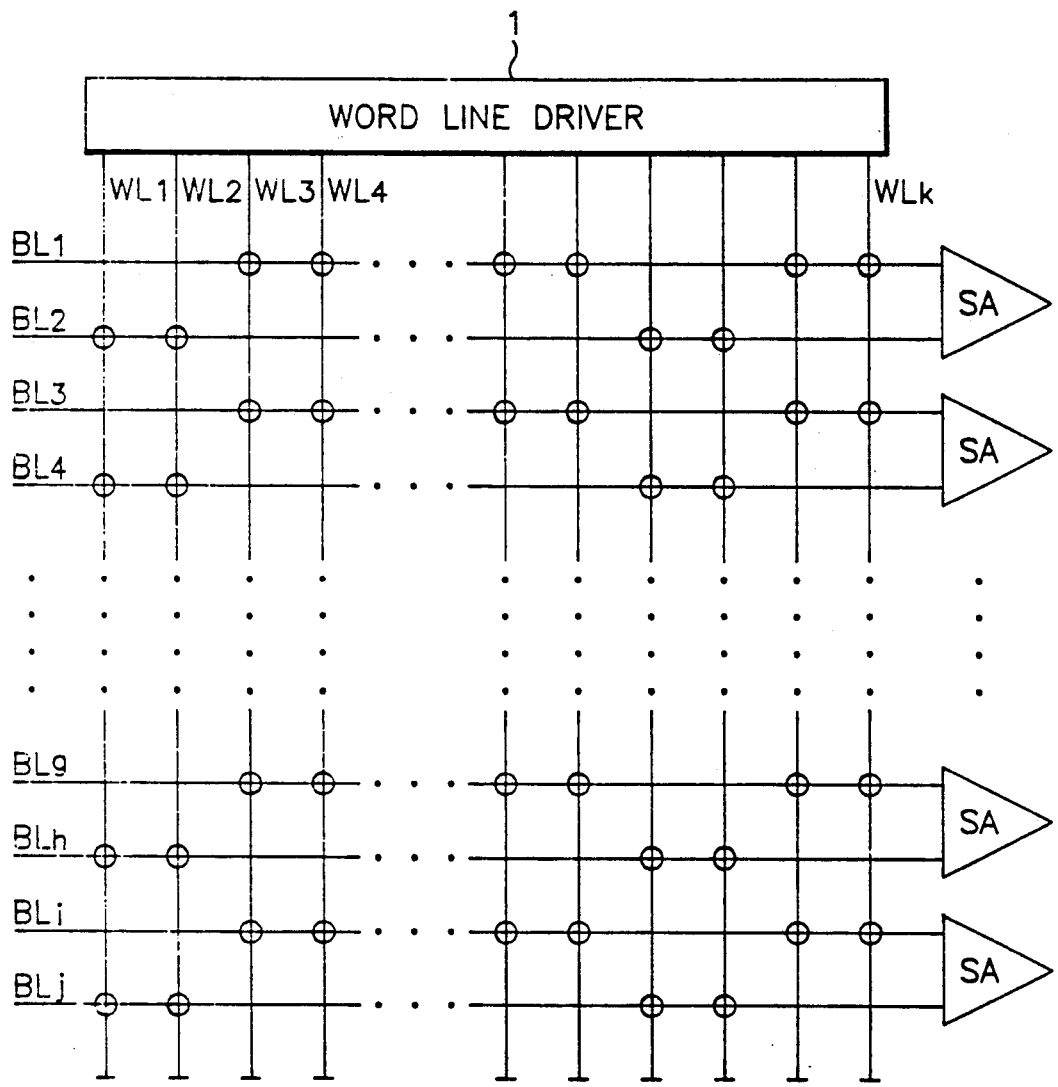
FIG. 1 is a layout diagram of a conventional semiconductor memory array.
Figure 2:
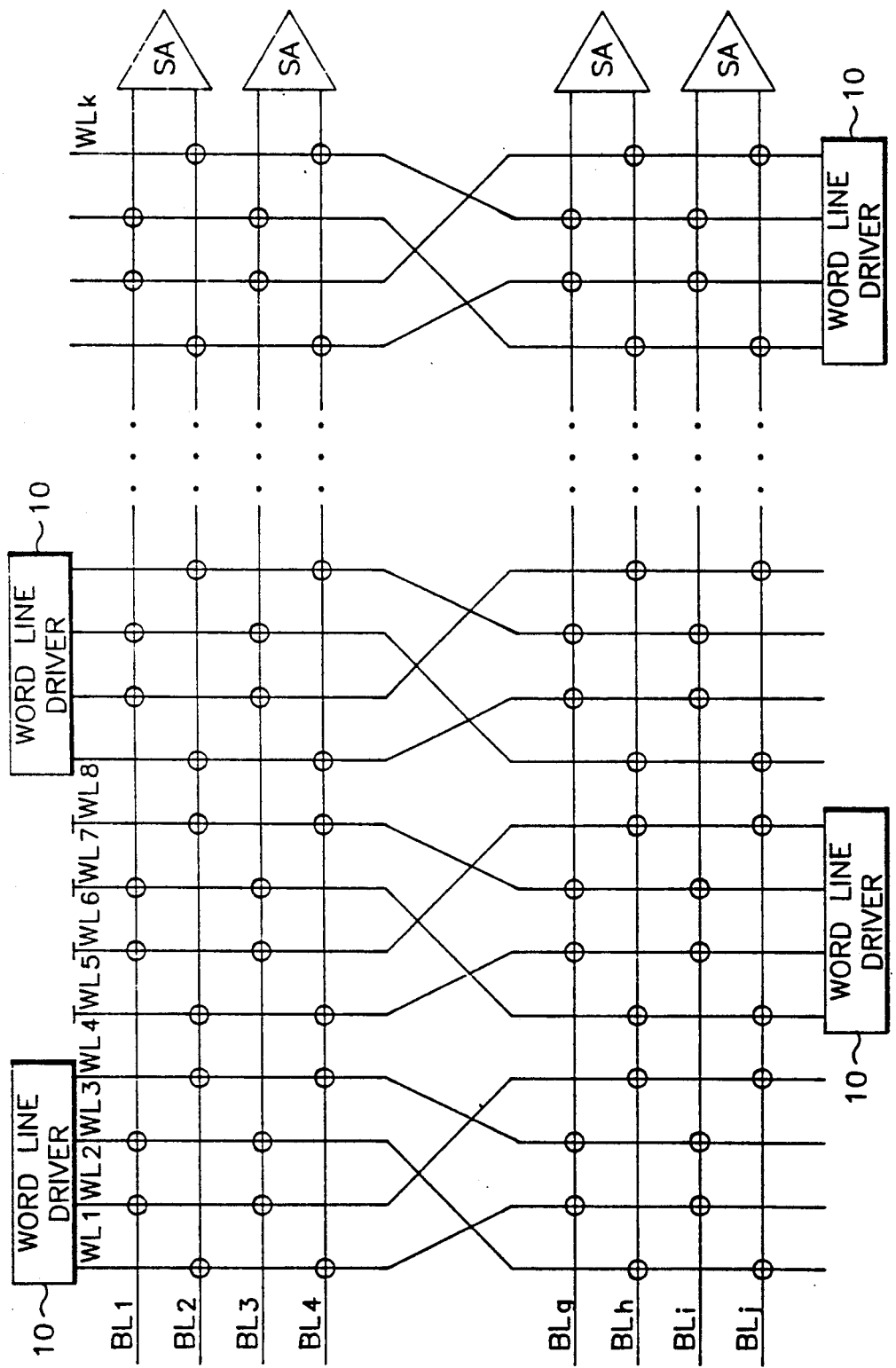
FIG. 2 is a layout diagram of the semiconductor memory array according to the present invention.
Figure 3A:
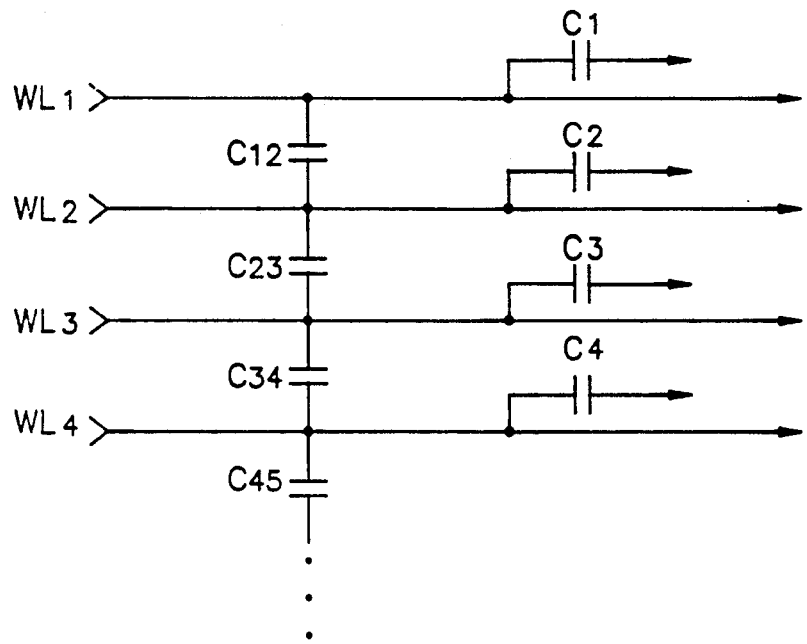
FIG. 3A is a circuit diagram illustrative of word line capacitive components according to FIG. 1.
Figure 3B:
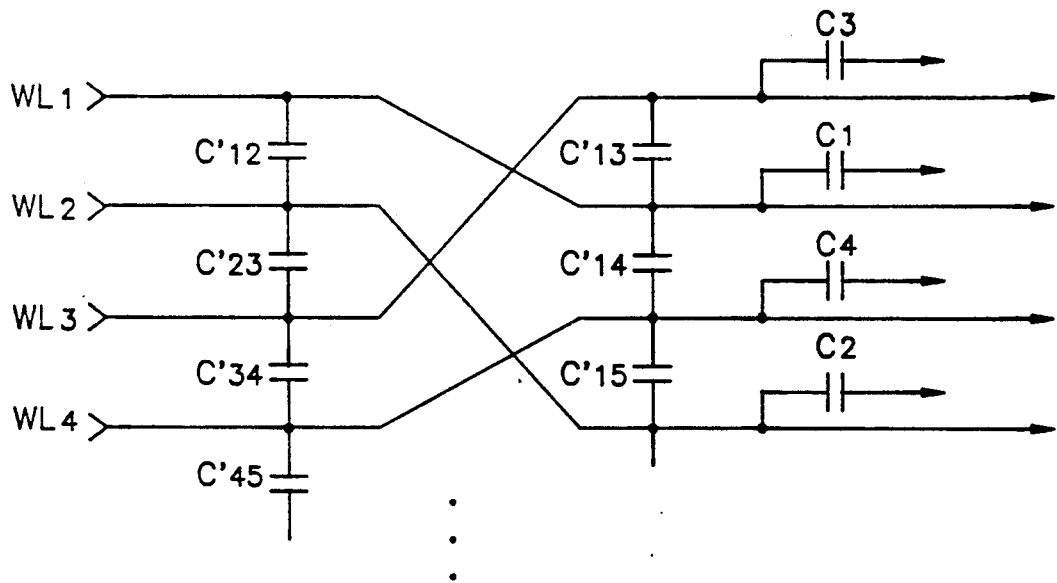
FIG. 3B is a circuit diagram illustrative of word line capacitive components according to FIG. 2.

FIG. 2 illustrates a layout diagram of the memory array according to the present invention, and FIG. 3B shows capacitive components according to the layout of FIG. 2. Referring to FIG. 2, a plurality of bit lines $BL_1$-$BL_j$ are connected in pairs to sense amplifiers SA, a plurality of word lines are arranged across the bit lines. A plurality of word line drivers 10 employing four word lines, each, are connected to the word lines wherein the word lines of each word line driver 10 are twisted once in the middle area of the word lines, that is, the strapping area.

For example, the second word line $WL_2$ is placed between the first word line $WL_1$ and the third word line $WL_3$ before being twisted, is placed between the fourth word line $WL_4$ and the seventh word line $WL_7$ after being twisted. The third word line $WL_3$ is placed in the first position adjacent the first word line $WL_1$ and the fourth word line $WL_4$ between the first word line $WL_1$, and the second word line $WL_2$, the first word line $WL_1$ between the third word line $WL_3$ and the fourth word line $WL_4$ after twisting. On the other hand, the word line drivers 10 are equally divided and arranged on both sides of the memory array in a zigzag or alternating arrangement. If the number of the word lines of the memory cell array is $2^n$, the number of the word lines connected to each word line driver is $2^m$ ($n > m \geq 0$, n,m:integer). So to speak, the number of the word lines employed by each word line driver 10 is $2^m$. Accordingly, the number of the word line drivers 10 placed on one side of the memory array is the same as on the other side of the memory array. The layout of the word line drivers 10 is illustrated in FIG. 2.

On the other hand, since the pitch between the twisted word lines is increased twice, the coupling capacitances between the twisted word lines are decreased by half. The reason is that the word lines are arranged in parallel. The principle that capacitance between parallel plates is inversely proportional to the space between the planes is applied in this case. The area required to twist the word lines is the joint area of the word lines, so that another area, required to twist the word lines is not needed. A decrease in coupling capacitance due to twisting the word lines is expressed by:

$$Cc' = \frac{1}{2} Cs$$

$$V_{CP} = \frac{Cc}{Cs + Cc'} \times V_{WL} \quad (2)$$

($V_{CP}$: voltage of word line coupling noise
$V_{WL}$: driving voltage of selected word line
Cc': coupling capacitance of word line
Cs: substrate capacitance of word line)

The effect of decreasing the coupling capacitance is illustrated in FIG. 3.

Therefore, the values of coupling capacitances $C'_{12}$, $C'_{23}$, $C'_{34}$, $C'_{45}$ of FIG. 3B are half the value of coupling capacitances $C_{12}$, $C_{23}$, $C_{34}$, $C_{45}$ of FIG. 3A.

Accordingly, as illustrated in the equation (2), since the coupling capacitance Cc' of FIG. 3B is decreased by half as compared with the coupling capacitance Cc of FIG. 3A, the word line coupling noise is also decreased by half.

In the embodiment of the present invention, four word lines are connected to each word line driver, but according to the experimental results, if more than four word lines are twisted with each other, the word line coupling noise is also decreased, so that as many word lines as required can be twisted with each other.

Moreover, the inventive method can be acceptable for buses having more than four input/output lines in the semiconductor memory device, for instance, the input/output lines and the data buses of column address decoders and row address decoders as well as the word lines.

In the embodiment of the present invention, the layout method of the word line drivers is described, but the row address decoders and the column address decoders can be arranged in the layout method of the present invention.

As described hereinabove, the present invention has an advantage in that in the layout of the memory cell array, the pitch margin is of the memory array is increased and the chip area is effectively used by equally dividing and arranging the word line drivers on both sides of the word lines.

The present invention has another advantage in that the word line coupling noise due to the word line operation is minimized by twisting the word lines in the strapping area.

While the invention has been particularly shown and described with reference to a preferred embodiment, it will be understood by those skilled in the art that modifications in detail may be made without departing from the spirit and scope of the invention.

What is claimed is:

1. In a semiconductor memory array having a plurality of word lines, a plurality of word line drivers for driving said word lines, and a plurality of row address decoders for driving said word line drivers, the improvement wherein:

each of said plurality of word line drivers is connected to a group of at least fourth neighboring word lines of said plurality of word lines, wherein said four neighboring word lines of said group are twisted across each other so that each one of said four neighboring word lines is not continually adjacent to its adjacent neighboring word lines, and wherein said plurality of word line drivers are equally spaced and arranged in an alternating pattern on both sides of said memory array.

2. The semiconductor memory array of claim 1, wherein said neighboring word lines are twisted across each other in a strapping area.

3. The semiconductor memory array of claim 1, wherein said neighboring word lines are twisted across each other in at least two parts of said memory array.

4. The semiconductor memory array of claim 1, wherein when said plurality of word line drivers are $2^N$ in number, said neightboring word lines within each of said plurality of word lines drivers are $2^K$ in number, wherein N is larger than K, and wherein N and K are positive integers.

5. The semiconductor memory array of claim 2, wherein when said plurality of word line drivers are $2^N$ in number, said neighboring word lines within each of said plurality of word line drivers are $2^K$ in number, wherein N is larger than K, and wherein N and K are positive integers.

6. The semiconductor memory array of claim 3, wherein when said plurality of word line drivers are $2^N$ in number, said neighboring word lines within each of said plurality of word line drivers are $2^K$ in number, wherein N is larger than K, and wherein N and K are positive integers.

7. In a semiconductor memory array having a plurality of word lines, a plurality of word line drivers for driving said word lines, and a plurality of row address decoders for driving said word line drivers, the improvement wherein:

each of said plurality of word line drivers is connected to a group of at least four neightboring word lines of said plurality of word lines, wherein said four neighboring word lines of said group are twisted across each other in a strapping area so that each one of said four neighboring word lines is adjacent different ones of said neighboring word lines on opposite sides of said strapping area.

8. The semiconductor memory array as claimed in claim 7, wherein when said plurality of word line drivers are $2^N$ in number, said neighboring word lines within each of said plurality of word line drivers are $2^K$ in number, wherein N is larger than K, and wherein N and K are positive integers, said word line drivers being equally spaced and arranged in an alternating pattern on both sides of said memory cell array.

* * * * *

UNITED STATES PATENT AND TRADEMARK OFFICE
CERTIFICATE OF CORRECTION

PATENT NO. : 5,097,441
DATED : 17 March 1992
INVENTOR(S) : Soo-In CHO et al.

It is certified that error appears in the above-identified patent and that said Letters Patent is hereby corrected as shown below:

Column 1, Line 51, insert --but-- after the comma;

Column 2, Line 3, replace the semicolon with a comma;

Column 4, Line 22, delete "is" (first occurrence);

IN THE CLAIMS

Claim 1, Column 4, Line 42, replace "fourth" with --four--;

Claim 7, Column 5, Line 13, replace "neightboring" with --neighboring--

Signed and Sealed this

Eighth Day of June, 1993

Attest:

MICHAEL K. KIRK

Attesting Officer

Acting Commissioner of Patents and Trademarks